United States Patent [19]
Paoli

[11] Patent Number: 5,699,375
[45] Date of Patent: Dec. 16, 1997

[54] MULTIPLE WAVELENGTH, SURFACE EMITTING LASER WITH BROAD BANDWIDTH DISTRIBUTED BRAGG REFLECTORS

[75] Inventor: Thomas L. Paoli, Los Altos, Calif.

[73] Assignee: Xerox Corporation, Stamford, Conn.

[21] Appl. No.: 676,751

[22] Filed: Jul. 8, 1996

[51] Int. Cl.$^6$ ............... H01S 3/19; H01S 3/10; H01S 3/08

[52] U.S. Cl. ............... 372/50; 372/23; 372/46; 372/96

[58] Field of Search ............... 372/96, 92, 45, 372/46, 23, 50

[56] References Cited

U.S. PATENT DOCUMENTS

| | | | |
|---|---|---|---|
| 5,052,016 | 9/1991 | Mahbobzadeh et al. | 372/96 |
| 5,245,622 | 9/1993 | Jewell et al. | 372/45 |
| 5,319,655 | 6/1994 | Thornton | 372/50 |
| 5,386,428 | 1/1995 | Thornton et al. | 372/23 |

OTHER PUBLICATIONS

Forchel et al, "Potential and Limitations of Selective Disordering processes in GaInAsP and AlGaInP Heterostructures", Conference Proceedings. Sixth International Conference On Indium Phosphide and Related Materials, New York: IEEE, pp. 375–378, Mar. 1994.

Sun et al, "Fabrication of Multi–Wavelength Lasers by Selective Intermixing of Si–Doped GaAs/AlGaAs Quantum Wells," Conference Proceedings. IEEE Lasers and Electro–Optics Society 1995 Annual Meeting. New York: IEEE, pp. 260–261, Oct. 1995.

*Primary Examiner*—Rodney B. Bovernick
*Assistant Examiner*—Luong-Quyen T. Phan
*Attorney, Agent, or Firm*—William Propp

[57] ABSTRACT

A multiple wavelength surface emitting laser has a first and second broad bandwidth distributed Bragg reflector (DBR) which reflect light at multiple wavelengths. The surface emitting laser structure comprises at least two cavities with each cavity containing one or more active layers for respectively emitting light at different wavelengths. In a preferred embodiment for a dual wavelength surface emitting laser, a first cavity contains a first active layer for emitting light of a first wavelength and a second cavity contains only a second active layers and emits only light of the second longer wavelength. The second layer has been eliminated in the first cavity and the first active layer has been eliminated in the second cavity by layer intermixing before completing the epitaxial growth.

34 Claims, 5 Drawing Sheets

MULTIPLE WAVELENGTH, SURFACE EMITTING LASER WITH BROAD BANDWIDTH DISTRIBUTED BRAGG REFLECTORS

BACKGROUND OF THE INVENTION

This invention relates to a multiple wavelength, surface emitting laser and, more particularly, to a multiple wavelength surface emitting laser with broad bandwidth Distributed Bragg Reflectors (DBRs) to reflect beams of the multiple wavelengths.

Addressable monolithic multiple wavelength light sources, such as laser arrays that can simultaneously emit light beams of different wavelengths from different elements in the array, are useful in a variety of applications, such as color printing, full color digital film recording, color displays, and other optical recording system applications.

Individually, semiconductor light emitting diodes and semiconductor lasers may have insufficient power for some of those applications. Arrays of semiconductor light emitting diodes or semiconductor lasers can be used to increase the total power output, to provide parallel processing, and to simplify optical system design. Arrays have been fabricated so that the light emitting elements are on a single semiconductor substrate in a monolithic structure to provide and maintain good optical alignment of the light emitting elements of the array with one another and to minimize the assembly involved.

One problem with such arrays is maintaining the electrical and optical isolation between the individual light emitting elements. Another problem is increasing the density of the light emitting elements in the substrate by closely spacing the elements together while still maintaining the isolation, avoiding heat dissipation problems, and providing precise alignment of the elements.

Yet another problem is making each individual light emitting element in the array independently addressable. As the light emitting elements are spaced closer together in higher densities, it is progressively more difficult to separately, individually and independently cause each element to emit light.

Also working against the high density is the requirement that the individual closely spaced emitted light beams be easy to separate or detect. Typically, beam separation is accomplished by having the array simultaneously emit light beams of different wavelengths from different elements in the array.

A dual wavelength laser has two active layers for emitting light at two different wavelengths in U.S. patent application Ser. No. 08/367,554, commonly assigned as the present application and herein incorporated by reference. Impurity induced layer intermixing removes a portion of the narrower bandgap, longer wavelength active layer to allow the wider bandgap, shorter wavelength active layer to emit light. However, the dual wavelength laser of that invention is an edge emitter.

Semiconductor lasers are typically edge emitters. The light is emitted from the edge of a monolithic structure of semiconductor layers. An alternative construction is surface emitters where the light is emitted from the surface of the monolithic structure of semiconductor layers.

Surface emitting semiconductor light sources have several advantages over edge emitters. The light emitting surface of a surface emitter is larger than that of an edge emitter. A surface emitter needs less power to emit light than an edge emitter. Fabrication of surface emitting lasers can be less complex than fabrication of edge emitting lasers since the cleaving and mirror passivation needed for edge emitters are eliminated. A higher density of laser emitters is possible with a surface emitting source than an edge emitting source.

A surface skimming laser does use multiple active layers to emit a partial vertical beam in addition to an edge emitted beam in U.S. Pat. No. 5,319,655, commonly assigned as the present application and herein incorporated by reference. However, the laser structure has a single active layer which emits light of a first wavelength, an active layer deposited on another active layer where only the top active layer which has the shorter bandgap will emit light of a second wavelength and an active layer deposited on two other active layers where only the top active layer which has the shortest bandgap will emit light of a third wavelength. And, as noted, the light is emitted both vertically and through the edge thus dividing the optical power of the beam. A surface skimming laser also radiates vertically over an area too large to allow high density.

U.S. Pat. No. 5,319,655 also uses the surface skimming structure as a basis for a multiple wavelength vertical cavity surface emitting laser. However, each laser in this structure contains one, two or three active layers sandwiched between distributed Bragg reflectors (DBR) with no separations between the active layers or between the active layer and the upper DBR. Although the active layer in the laser with one active layer is positioned at the peak of the optical standing wave established by reflections from the DBRs, the radiating active layer in the laser containing two active layers is misaligned with that laser's optical standing wave. Similarly, the radiating active layer in the laser containing three active layers is even more misaligned with that laser's optical standing wave. Thus the surface emitting lasers taught in the patent are inefficient and have an excessively high threshold or are restricted to closely spaced wavelengths. Since poor efficiency and high threshold cause poor optical performance in laser arrays with closely spaced emitters, e.g. excessive power droop and excessive crosstalk between lasers, arrays of multiple wavelength surface emitting lasers must be designed with minimum threshold and maximum efficiency in order to be useful in optical recording applications.

It is an object of the invention to provide a monolithic structure of independently addressable, high density, multiple wavelength surface emitting lasers with broad bandwidth DBRs and improved performance.

It is another object of the invention to provide a monolithic structure of independently addressable, high density, multiple wavelength surface emitting lasers with multiple active layers for emitting light of different wavelengths.

It is yet another object of this invention to provide a monolithic structure of multiple wavelength surface emitting lasers with multiple active layers for emitting light of different wavelengths where impurity induced layer intermixing removes a portion of a narrower bandgap, longer wavelength active layer to allow a wider bandgap, shorter wavelength active layer to emit light.

SUMMARY OF THE INVENTION

In accordance with the present invention, a multiple wavelength surface emitting laser has a first and second broad bandwidth distributed Bragg reflector (DBR) which reflect light at multiple wavelengths. The surface emitting laser structure comprises two cavities with each cavity containing one or more active layers for respectively emitting light at different wavelengths. In a preferred embodiment for a dual wavelength surface emitting laser, a first cavity contains a first active layer for emitting light of a first wavelength and a second cavity contains the first and second active layers and emits only light of the second longer wavelength. The second layer has been eliminated in the first cavity by selective layer intermixing before completing the epitaxial growth. In a second preferred embodiment, the second layer has been eliminated in the first cavity by selective layer intermixing and the first layer has been eliminated in the second cavity by selective layer intermixing before completing the epitaxial growth.

Other objects and attainments together with a fuller understanding of the invention will become apparent and appreciated by referring to the following description and claims taken in conjunction with the accompanying drawings.

DESCRIPTION OF THE PREFERRED EMBODIMENT

Figure 1:
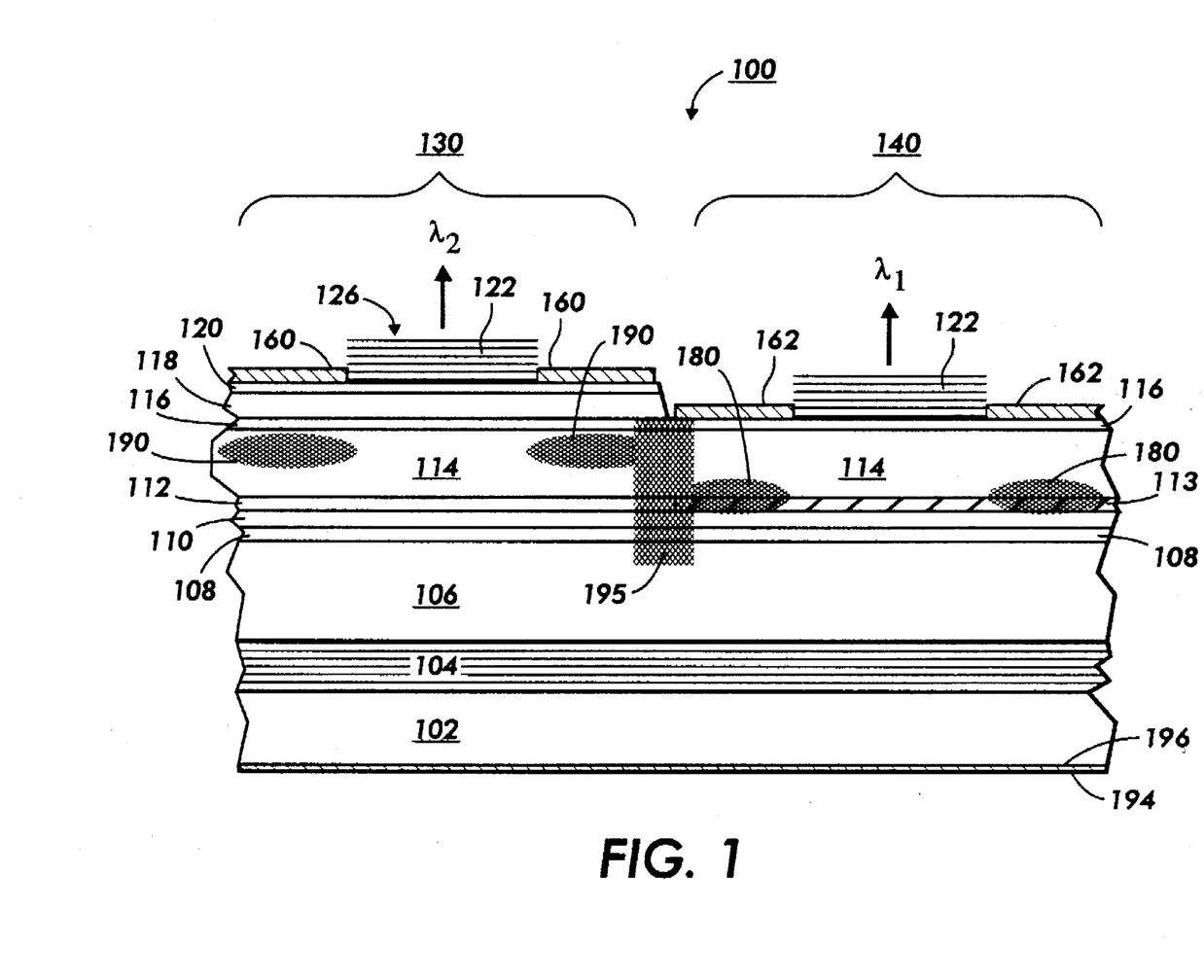
FIG. 1 is a schematic illustration of a cross-section side view of a high density, dual wavelength, surface emitting monolithic laser structure with broad bandwidth Distributed Bragg Reflectors and with two active layers in one laser cavity formed according to the present invention.

Reference is now made to FIG. 1, wherein there is illustrated a high density, independently addressable, dual wavelength, surface emitting monolithic laser structure 100 as a first embodiment of this invention.

The monolithic laser structure 100 can be fabricated by a technique such as metalorganic chemical vapor deposition (MOCVD) as is well known in the art. In this embodiment, the monolithic laser structure 100 comprises a substrate 102 of n-GaAs upon which is epitaxially deposited a first or lower broad bandwidth DBR 104 of alternating layers of n-$Al_{0.5}Ga_{0.5}As$ and n-AlAs, a first or lower spacer layer 106 of n-$(Al_xGa_{1-x})_{0.5}In_{0.5}P$ ($0.5<x<1.0$) which is 20 to 200 nm thick, a first or lower active quantum well layer 108 of $Ga_zIn_{1-z}P$, which is 8 to 10 nm thick, a second or lower intermediate spacer layer 110 of undoped $(Al_xGa_{1-x})_{0.5}In_{0.5}P$ ($0.3<x<0.5$) which is 5 to 50 nm thick, a second or upper active quantum well layer 112 of $Al_yGa_{1-y}As$ ($0<y<0.3$) which is 8 to 10 nm thick, a third or upper intermediate spacer layer 114 of p-$Al_xGa_{1-x}As$ ($0.5<x<0.8$) which is 20 to 200 nm thick, a first etch stop layer 116 of p-$Ga_{0.5}In_{0.5}P$ or p-GaAs which is nominally 5 nm thick, a fourth or upper spacer layer 118 of p-$Al_xGa_{1-x}As$ ($0.5<x<0.8$) which is 5 to 200 nm thick, and a protective contact layer 120 of p-$Ga_{0.5}In_{0.5}P$ or p-GaAs which is 4 to 10 nm thick.

The fourth or upper spacer layer 118 is selectively removed from a portion of the monolithic laser structure 100 by stopping after the growth of the protective layer 120 for etching. The thin etch stop layer 116 of $Ga_{0.5}In_{0.5}P$ embedded below the upper spacer layer 118 serves as a stop etch layer and a protective layer for the epitaxial growth of an upper DBR in the etched region. Similarly the protective layer 120 provides an Al-free surface on which to epitaxially grow the upper DBR in the non-etched region after the selective etching.

A portion 130 of the monolithic laser structure 100 is covered by a mask and the remainder 140 is etched down to the first etch stop layer 116 as is well known in the art, thus removing portions of the protective layer 120 and the upper spacer layer 118.

Formation of the monolithic laser structure 100 continues after the etching with removal of the mask and epitaxial deposition upon the protective layer 120 of the non-etched portion and upon the etch stop layer 116 of the etched portion of a second or upper broad bandwidth DBR 122 of alternating layers of undoped AlAs and $Al_{0.5}Ga_{0.5}As$ with a top surface 126.

The broad bandwidth DBR 104 consists of 60 to 120 alternating layers of n-$Al_{0.5}Ga_{0.5}As$ and n-AlAs. For example, the DBR may be a 60 quarter-wave stack at the design wavelength which is usually taken to be the mean of $\lambda_1$ and $\lambda_2$ in the semiconductor layers. The thicknesses of the semiconductor layers are a quarter of the wavelength or nominally 50 nm for red and infrared wavelengths. The first or lower n-DBR 104 will be approximately 3 microns thick. DBRs of this type are described by R. P. Schneider, et al., in *IEEE Photonics Technology Letters*, vol 6, pp 313–316 (March 1994). Thus, this broad bandwidth DBR 104 will reflect at the wavelengths of light emitted from both the first active layer and the second active layer.

The second or upper DBR 122 consists beneficially of 10 to 20 alternating layers of $Al_{0.5}Ga_{0.5}As$ and AlAs oxide similar to that described by M. H. MacDougal, et al., in *IEEE Photonics Technology Letters*, vol 7, pp 229–231 (March 1995). For example, the DBR may be a 10 quarter-wave stack at the design wavelength. The thicknesses of the $Al_{0.5}Ga_{0.5}As$ and oxidized AlAs layers are a quarter of the wavelength which is nominally 50 nm in the $Al_{0.5}Ga_{0.5}As$ and nominally 120 nm in the oxidized AlAs. The second or upper p-DBR will be approximately 0.85 microns thick. The upper DBR 122 is laterally patterned in order to expose contact layers 116 and 120 and to enable conversion of the AlAs layers in the as grown DBR to AlAs oxide as described by MacDougal, et al. Alternatively, the second or upper DBR 122 can be similar to the first or lower DBR 104 except with undoped, not n, conductivity. Thus, this broad bandwidth DBR 122 will reflect at the wavelengths of light emitted from both the first active layer and the second active layer.

An advantage of this structure is that the active and spacer layers for the two laser cavities can be individually optimized for each wavelength. A further advantage is that the thicknesses of the spacer layers can be independently adjusted such that each active layer configuration is located at a peak of the optical standing wave in its respective cavity.

The first laser cavity 140 is under the etched portion within the monolithic structure 100 and consists of the first etch stop layer 116, the third or upper intermediate spacer layer 114, the selectively intermixed region 113 described below, the second or lower intermediate spacer layer 110, the first active quantum well layer 108 and the first or lower spacer layer 106. The laser cavity can be formed with one of several different techniques. For example, the embodiment of FIG. 1 illustrates formation of a gain-guided cavity by confining the current with proton bombardment regions 180.

The second laser cavity 130 is under the non-etched portion within the monolithic structure 100 and consists of the protective layer 120, the fourth or upper spacer layer 118, the first etch stop layer 116, the third or upper intermediate spacer layer 114, the second active quantum well layer 112, the second or lower intermediate spacer layer 110, the first active quantum well layer 108, and the first or lower spacer layer 106. For example, the embodiment of FIG. 1 illustrates formation of a gain-guided cavity by confining the current with proton bombardment regions 190.

The side-by-side lasers are electrically isolated from each either by a proton implantation in region 195 or an etched groove in region 195.

Without the intermixed region 113 in laser cavity 140 the first laser cavity will, with current applied to both active layers, emit light at the second longer wavelength from the second active layer 112 rather than the first active layer 108 because the second active layer has the narrower bandgap and the injected carriers preferentially populate the lowest energy active layer in the structure.

To force the laser cavity to lase at the shorter wavelength (higher energy) of the wider band gap of the first active layer 108, the portion 113 of the second active layer 112 must be disabled in the laser structure 100. This can be accomplished in a first embodiment by modifying the composition of the region 113 so that its band gap is wider than that of the first active layer 108. Thus, in the laser cavity, the lower energy active layer preferentially populated would be the first active layer 108 and not the second active layer 112. The problem, however, is how to modify the composition of the buried region 113 without changing the composition of the first active layer 108 portion beneath or that of the adjacent second active layer 112 portion, bearing in mind that the typical spacing, laterally, of the laser cavities is 10 to 500 micron, and the typical spacing, vertically, of the first and second active layers 108 and 112 is 5 to 50 nm.

According to the present invention, the active layer 112 is eliminated in the laser cavity 140 by selectively intermixing the second active layer 112 in region 113. This selective intermixing can be accomplished as described in Ser. No. 08/367,554 by inducing layer intermixing from a finite source of impurities.

The concept underlying the present invention as applied to the monolithic laser structure 100 involves intermixing the longer wavelength quantum well layer 112 with the upper intermediate spacer layer 114 while preserving the shorter wavelength quantum well layer 108. Thus the active layer 112 is eliminated in the laser cavity 140 by selectively intermixing the second active layer 112 in region 113. Selective capping conditions are used to control where the intermixing of the second active layer will occur.

By "thermal annealing" is meant heating at a temperature typically in the range of 700°–1000° C. and holding it within that temperature range for 1 to 100 hours. By "rapid thermal annealing" is meant ramping up to the temperature range indicated above within 1 minute or less, and cooling down within 10 minutes or less. Both thermal annealing and rapid thermal annealing are considered annealing for the purposes of this application.

A preferred method for selective intermixing utilizes the large difference in the Al and Ga interdiffusion coefficients for the AlGaAs and GaInP materials systems during vacancy enhanced intermixing as described in U.S. Ser. No. 08/367, 554, commonly assigned as the present application and herein incorporated by reference. The intermixing is preferably achieved in this embodiment by selectively capping the structure with $Si_3N_4$ and $SiO_2$ and annealing. During the anneal, the AlGaAs quantum well is intermixed with the upper intermediate spacer layer while the GaInP quantum well may be partially intermixed and experience a small wavelength shift. This shift should be minimal because of the large difference in the Al and Ga interdiffusion coefficients and can be further minimized by judicious selection of well widths. The wavelength shift associated with partial intermixing of a quantum well is larger for a narrower well, so that further discrimination between the extent of wavelength shift of the IR and red quantum wells can be obtained by using a narrow well (smaller than about 100 Å) for IR, where extremely large shifting is desired, and a wide well (greater than about 100 Å) for the red, where minimal shifting is desired. The limiting case of this, where the red portion is wide enough to behave as bulk rather than as a quantum well, would eliminate shifting of the red wavelength during the anneal. Thus one possible variation of the invention is to replace the GaInP quantum well active region with a wider (greater than about 200 Å) $(Al_xGa_{1-x})_{0.5}In_{0.5}P$ layer which would behave as bulk material. Alternatively, or in addition, the AlGaAs active region can be optimized by including thin layers of higher Al composition to enhance the band gap increase upon intermixing.

In a first method, the monolithic laser structure 100 is grown containing an undoped GaInP quantum well first active layer 108 for red emission and a second AlGaAs or GaAs quantum well active layer 112 for IR emission. The second active layer contains a finite amount of a p-type impurity, e.g. Zn, in layer 112, that is sufficient to intermix the quantum well while leaving the nearby first active layer 108 intact, as described in U.S. Ser. No. 08/367,554. Then the portions of the surface under which active layer 112 is to remain unmixed are covered with $Si_3N_4$ while the remainder of the surface under which active layer 112 is to be intermixed are left uncovered. Next the structure is subjected to a high temperature anneal (in the range of about 700° to 1000° C.) with the surface of the structure covered with a GaAs wafer or in a sealed ambient with a Ga ambient for a time sufficient to intermix region 113 of active layer 112. Arsenic vacancies produced by the gallium-rich conditions promote impurity-induced layer mixing with p-type impurities but do not enable impurity-induced layer mixing of undoped material. Thus the in-diffusion of arsenic vacancies produces intermixing of layer 112 in region 113 but does not substantially affect the underlying portion of active layer 108.

In a second method, the monolithic laser structure 100 is grown containing a GaInP quantum well first active layer 108 for red emission and a second AlGaAs or GaAs quantum well active layer 112 for IR emission. Both active layers are grown undoped. Then the portions of the surface under which active layer 112 is to be intermixed are covered with $SiO_2$ while the remainder of the surface under which active layer 112 is to remain unmixed are covered with $Si_3N_4$. Next the structure is subjected to a high temperature anneal (in the range of about 800° to 1000° C.) for a time sufficient to intermix region 113 of active layer 112. As described in U.S. Ser. No. 08/367,554, the $SiO_2$ cap acts as a source of Ga vacancies by absorbing outdiffusing As. Thus the AlGaAs layer under the $SiO_2$ are intermixed in region 113 by vacancy enhanced intermixing. On the other hand, the same layers in the regions capped with $Si_3N_4$ and the GaInP active layer under the $SiO_2$ cap remain essentially unchanged. A disadvantage of this method is that the intermixed region 113 is p-doped only the extent that p-dopant from the adjacent spacer layer 114 diffuses into region 113 during the intermixing. In some cases this may be sufficient.

It is preferred to provide an $SiO_2$ cap over the region sought to be intermixed, as an $SiO_2$ cap enhances the intermixing of the AlGaAs quantum well by providing Ga vacancies, while material under an $Si_3N_4$ cap remains essentially unchanged. The AlGaInP quantum well under the $SiO_2$ cap undergoes much less intermixing than the AlGaAs quantum well, because of the much smaller Al and Ga interdiffusion coefficient in the AlGaInP. However, it will be understood that the invention is not limited to an $SiO_2$ cap, and other vacancy inducing materials may be substituted.

In a third method, the monolithic laser structure 100 is grown containing an undoped GaInP quantum well first active layer 108 for red emission and a second AlGaAs or GaAs quantum well active layer 112 for IR emission. The second active layer contains a finite amount of an impurity, e.g. Si or Ge, that is sufficient to intermix the quantum well while leaving the nearby first active layer 108 intact, as described in U.S. Ser. No. 08/367,554. Then the portions of the surface under which active layer 112 is to remain unmixed are covered with $Si_3N_4$ while the remainder of the surface under which active layer 112 is to be intermixed are left uncovered. Next the structure is annealed under extreme gallium-rich conditions at a high temperature (in the range of about 700° to 1000° C.) for a time sufficient to intermix region 113 of active layer 112. As described in U.S. Pat. No. 5,375,583, commonlay assigned as the present application and herein incorporated by reference, the extreme gallium-rich conditions enable arsenic vacancies to propagate into layer 112 and create a p-doped intermixed region 113. Extreme gallium-rich conditions can be provided by performing the annealing in a sealed ampoule with a Ga ambient. The p-type intermixed region is beneficial because it extends the p-type conductivity through the intermixed region 113. Active layer 112 and active layer 108 remain essentially unchanged in regions under the $Si_3N_4$ cap where there are no arsenic vacancies to induce the layer intermixing.

There are various alternate means of patterning the surface to produce intermixed region 113 within the scope of the invention. Other material combinations and annealing environments could be used to perform the laterally patterned intermixing.

Following the patterned intermixing of the AlGaAs active region, the first and second laser cavities 140 and 130 are formed by established methods, as described earlier. Our preferred embodiment uses proton implantation regions 180 to confine the injection current in laser cavity 140, proton implantation regions 190 to confine the injection current in laser cavity 130, and an etched groove in region 195 to isolate the laser cavities.

Standard evaporation techniques are employed to form metal contacts to the first and second lasers. The p-side of the first laser cavity 140 is contacted over the etched portion of the structure with an annular metal contact 162 of Cr—Au or Ti—Pt—Au on the top surface of the cap layer 116. Contact 194 to the n-side of the first laser cavity 140 is provided by an alloyed Au—Ge metallization, followed by Cr—Au or Ti—Pt—Au, on the bottom surface 196 of the substrate 102.

The p-side of the second laser cavity 130 is contacted over the non-etched portion of the structure with an annular metal contact 160 of Cr—Au or Ti—Pt—Au on the top surface of the contact layer 120. Contact 194 provides the contact to the n-side of the second laser cavity 130.

The first active layer 108 of GaInP has a wider bandgap than the second active layer 112 of GaAs or AlGaAs and thus the first active layer 108 will lase at a shorter first wavelength than the second active layer 112. In this illustrative example, the first active layer of GaInP will lase in the red.

The second active layer 112 of GaAs or AlGaAs has a narrower bandgap than the first active layer 108 of GaInP and thus the second active layer 112 will lase at a longer second wavelength than the first active layer 108. In this illustrative example, the second active layer of GaAs or AlGaAs will lase in the infrared.

Voltage applied to the first contact 162 and the common contact 194 will cause the first active quantum well layer 108 of the first laser cavity 140 to emit light of a first wavelength through the first emission window in the top surface of the laser structure 100 not covered by the first contact 162. The first cavity 140 only contains the first active quantum well layer 108.

Voltage applied to the second contact 160 and the and the common contact 194 will cause the second active quantum well layer 112 of the second laser cavity 130 to emit light of a second wavelength through the second emission window in the top surface of the laser structure 100 not covered by the second contact 160. The second laser cavity 130 contains both the first active quantum well layer 108 and the second active quantum well layer 112. Only the second active quantum well layer 112 will emit lasing light.

The laser cavity length in an edge emitter laser is many thousands of times the wavelength of the emitted light. Exacting precision in the laser cavity length is thus not critical in an edge emitter. On the contrary, the laser cavity length in a surface emitter laser is only a small single digit or low double digit multiple of the wavelength of the emitted light.

Accordingly, the thicknesses of the spacer layers are chosen to place each of the active quantum wells of the first and second active layers at the peak of the cavity's standing wave corresponding to the wavelength emitted by each quantum well. This matching of wavelength and laser cavity length avoids nulls and phase mismatching of the emitted light beam.

Thus, the first active layer 108 is physically positioned in the first cavity 140 at the peak of the standing wave of the red wavelength that the first active layer emits. And, the second active layer 112 is physically positioned in the second cavity 130 at the peak of the standing wave of the infrared wavelength that the second active layer emits. The first and second active layers may be positioned at the peak of their respective standing waves by locating each active layer at the center of its cavity. Alternatively, the second active layer may be positioned at the peak of its standing wave by using a cavity length that is 2 times the wavelength in the semiconductor and placing the active layer at ¼ of the cavity length below the upper DBR. Other asymmetric arrangements are possible for cavities that are integer multiples of the wavelength.

The second active quantum well layer 112 can alternatively comprise GaAsP, InGaAsP, or AlGaAsP, all materials which emit light in the infrared spectrum. Alternatively, the single active quantum wells can be replaced by multiple quantum wells separated by appropriate barrier layers as is well known in the art. Also the upper DBR and lower DBR can comprise alternating layers of InAlP and InAlGaP.

Figure 2:
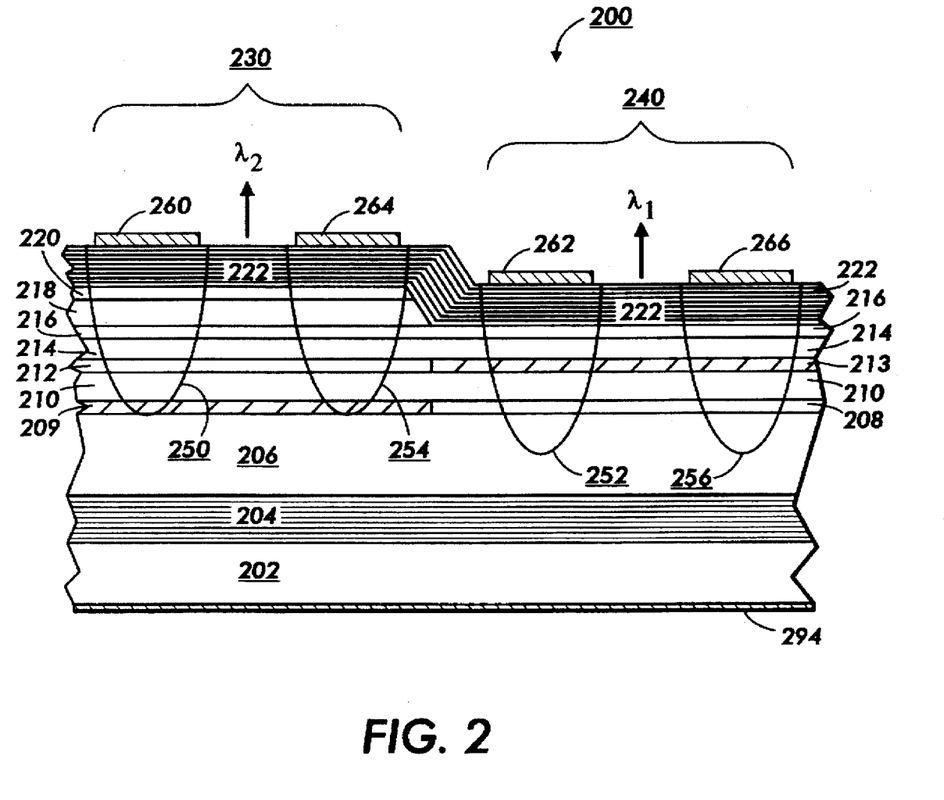
FIG. 2 is a schematic illustration of a cross-section side view of a second embodiment of a high density, dual wavelength, surface emitting monolithic laser structure with broad bandwidth Distributed Bragg Reflectors, with one active layer in each laser cavity, and with same side electrodes formed according to the present invention.

Reference is now made to FIG. 2, wherein there is illustrated a high density, independently addressable, dual wavelength, surface emitting monolithic laser structure 200 as a second embodiment of this invention.

The monolithic laser structure 200 can be fabricated by a technique such as metalorganic chemical vapor deposition (MOCVD) as is well known in the art. In this embodiment, the monolithic laser structure 200 comprises a substrate 202 of semi-insulating GaAs upon which is epitaxially deposited a first or lower broad bandwidth DBR 204 of alternating layers of undoped $Al_{0.5}Ga_{0.5}As$ and undoped AlAs, a first or lower spacer layer 206 of undoped $Al_xGa_{1-x}As$ (0.5<x<0.8) which is 20 to 200 nm thick, a first or lower active quantum well layer 208 of $Al_yGa_{1-y}As$ (0<x<0.3), which is 8 to 10 nm thick, a second or lower intermediate spacer layer 210 of undoped $Al_xGa_{1-x}As$ (0.5<x<0.8) which is 5 to 100 nm thick, a second or upper active quantum well layer 212 of GaAs which is 8 to 10 nm thick, a third or upper intermediate spacer layer 214 of undoped $Al_xGa_{1-x}As$ (0.5<x<0.8) which is 20 to 200 nm thick, a first etch stop layer 216 of undoped $Ga_{0.5}In_{0.5}P$ or GaAs which is nominally 5 nm thick, a fourth or upper spacer layer 218 of undoped $Al_xGa_{1-x}As$ (0.5<x<0.8) which is 20 to 200 nm thick, and a protective layer 220 of undoped GaInP or undoped GaAs which is 4 to 10 nm thick.

The fourth or upper spacer layer 218 is selectively removed from a portion of the monolithic laser structure 200 by stopping after the growth of the protective layer 220 for etching. The thin etch stop layer 216 of GaInP embedded below the upper spacer layer 218 serves as a stop etch layer and a protective layer for the epitaxial growth of an upper DBR in the etched region. Similarly the protective layer 220 provides an Al-free surface on which to epitaxially grow the upper DBR in the non-etched region after the selective etching.

A portion 230 of the monolithic laser structure 200 is covered by a mask and the remainder 240 is etched down to the first etch stop layer 216 as is well known in the art, thus removing portions of the protective layer 220 and the upper spacer layer 218.

Formation of the monolithic laser structure 200 continues after the etching with removal of the mask and epitaxial deposition upon the protective layer 220 of the non-etched portion and upon the etch stop layer 216 of the etched portion of a second or upper broad bandwidth DBR 222 of alternating layers of undoped AlAs and $Al_{0.5}Ga_{0.5}As$ with a top surface 226.

According to the present invention, portions of active layers 208 and 212 are beneficially eliminated by selective intermixing. Active layer 212 is eliminated in laser cavity 240 by selective intermixing in region 213. Similarly, active layer 208 is eliminated in laser cavity 230 by selective intermixing in region 209. Selective capping conditions are used to control where the intermixing of the first and second active layers will occur.

The monolithic laser structure 200 is grown containing an AlGaAs quantum well first active layer 208 for emission at a first short wavelength and a second AlGaAs or GaAs quantum well active layer 212 for emission at a second longer wavelength. The first active layer 208 contains a finite amount of an n-type impurity, e.g. Si or Ge, that is sufficient to intermix active layer 208 while leaving the nearby second active layer 212 intact. Similarly the second active layer 212 contains a finite amount of a p-type impurity, e.g. Zn, that is sufficient to intermix active layer 212. The selective intermixing of active layers 208 and 212 is achieved by selectively activating the impurities through selective capping of the structure during annealing.

Active layer 212 is intermixed in region 213 by annealing this portion of the structure under gallium-rich conditions as described in the teaching for embodiment 100. Arsenic vacancies produced by the gallium-rich conditions promote impurity-induced layer mixing with p-type impurities but do not enable impurity-induced layer mixing with n-type impurities. Thus the in-diffusion of arsenic vacancies produces intermixing of layer 212 in region 213 but does not substantially affect the underlying portion of active layer 208. Gallium-rich conditions can be provided by covering the surface of the structure with a GaAs wafer during the annealing or performing the annealing in a sealed ampoule with a Ga ambient.

Active layer 208 is intermixed in region 209 by annealing this portion of the structure under arsenic-rich conditions. Gallium vacancies produced by the arsenic-rich conditions promote impurity-induced layer mixing with n-type impurities but do not enable impurity-induced layer mixing with p-type impurities. Thus the in-diffusion of gallium vacancies produces the intermixing of layer 208 in region 209 but does not substantially affect the overlying portion of active layer 212. Arsenic-rich conditions can be provided by covering the surface of the structure with $SiO_2$ which acts as a source of Ga vacancies by absorbing outdiffusing Ga atoms during the anneal or by performing the annealing of an uncapped surface in a sealed ampoule with an arsenic ambient.

Thus for embodiment 200, active layer 212 remains in laser cavity 230 but is eliminated in laser cavity 240. Similarly, active layer 208 remains in laser cavity 240 but is eliminated in laser cavity 230. This elimination the active layer 208 in laser cavity 230 is advantageous because it eliminates the wasted current supplied to spontaneous recombination in this portion of active layer 208 and allows the laser to operate at a lower temperature The first laser cavity 240 is under the etched portion within the monolithic structure 200 and consists of the first etch stop layer 216, the third or upper intermediate spacer layer 214, the selectively intermixed region 213, the second or lower intermediate spacer layer 210, the first active quantum well layer 208 and the first or lower spacer layer 206.

The second laser cavity 230 is under the non-etched portion within the monolithic structure 200 and consists of the protective layer 220, the fourth or upper spacer layer 218, the first etch stop layer 216, the third or upper intermediate spacer layer 214, the second active quantum well layer 212, the second or lower intermediate spacer layer 210, the selectively intermixed region 209, and the first or lower spacer layer 206.

The first and second laser cavities are defined within the epitaxially deposited layers by semi-annular cathodes 250 and 252 and semi-annular anodes 254 and 256. The cathodes 250 and 252 comprise an n-type wide bandgap material formed by impurity induced layer disordering of the as-grown multiple layers and serve as the electron source for the undoped active layers 212 and 208, respectively. The anodes 254 and 256 comprise a p-type wide bandgap material formed by impurity induced layer disordering of the as-grown multiple layers and serve as the hole source for the undoped active layers 212 and 208, respectively. The cathodes 250 and 252 and the anodes 254 and 256 beneficially extend through the upper DBR 222 and into the lower spacer layer 206 or the lower DBR 204 to form respectively cylindrical optical waveguides for the surface emitting laser cavities 240 and 230. Proton bombardment (not shown) provides electrical isolation between the cathode 250 and the anode 254 and between the cathode 252 and the anode 256 as taught in U.S. Pat. No. 5,455,429, commonly assigned as the present application and herein incorporated by reference.

Electrical connections are made to lasers 230 and 240 through the cathode metal contacts 260 and 262, which are connected to the cathodes 250 and 252 and the anode metal contacts 264 and 266 which are connected to the anodes 254 and 256. Standard techniques are employed as well known in the art to form ohmic metal contacts on the top surface 226.

Voltage applied to the second cathode contact 262 and the second anode contact 266 will cause the first active quantum well layer 208 of the first laser cavity 240 to emit light of a first wavelength through the emission window in the top surface 226 of the monolithic structure 200. The first cavity 240 contains only the first active quantum well layer 208.

Voltage applied to the first cathode contact 260 and the first anode 264 will cause the second active quantum well layer 212 of the second laser cavity 230 to emit light of a second wavelength through the emission window in the top surface 226 of the monolithic structure 200. The second cavity 230 contains only the second active quantum well layer 212.

The first or lower DBR 204 is constructed to have a reflectivity as close to one as possible while the second or upper DBR 222 is constructed with a reflectivity close to one but less than that of the first DBR.

The light is emitted through the upper broad bandwidth DBR 222, substantially perpendicular to the top surface 226 and 227 of the top layer 224, hence monolithic laser structure 200 is a surface emitting laser. The emitted light can be either continuous wave or pulse.

The laser cavity length in an edge emitter laser is many thousands of times the wavelength of the emitted light. Exacting precision in the laser cavity length is thus not critical in an edge emitter. On the contrary, the laser cavity length in a surface emitter laser is only a small single digit or low double digit multiple of the wavelength of the emitted light.

Accordingly, the thicknesses of the spacer layers 206, 210, 214, and 218 are chosen to place each of the active quantum wells of the first and second active layers at or near the peak of the cavity's standing wave corresponding to the wavelength emitted by each quantum well. This matching of wavelength and laser cavity length avoids nulls and phase mismatching of the emitted light beam.

Thus, the first active layer 208 is physically positioned in the first cavity 240 at the peak of the standing wave at the wavelength that the first active layer emits. And the second active layer 212 is physically positioned in the second cavity 230 at the peak of the standing wave at the wavelength that the second active layer emits. The first and second active layers may be positioned at the peak of their respective standing waves by locating each active layer at the center of its cavity. Alternatively, the second active layer may be positioned at the peak of its standing wave by using a cavity length that is 2 times the wavelength in the semiconductor and placing the active layer at ¼ of the cavity length below the upper DBR. Other asymmetric arrangements are possible for cavities that are integer multiples of the wavelength.

The first and second laser cavities can be electrically and optically isolated from each other by etching a groove between the two cavities (not shown) or by proton bombardment of the region between the two cavities (not shown). In embodiments where carrier injection is lateral between the anode and cathode as described in FIG. 2, no additional electrical isolation may be required since the layers are undoped.

Alternatively, the single active quantum wells can be replaced by multiple quantum wells separated by appropriate barrier layers as is well known in the art.

Figure 3:
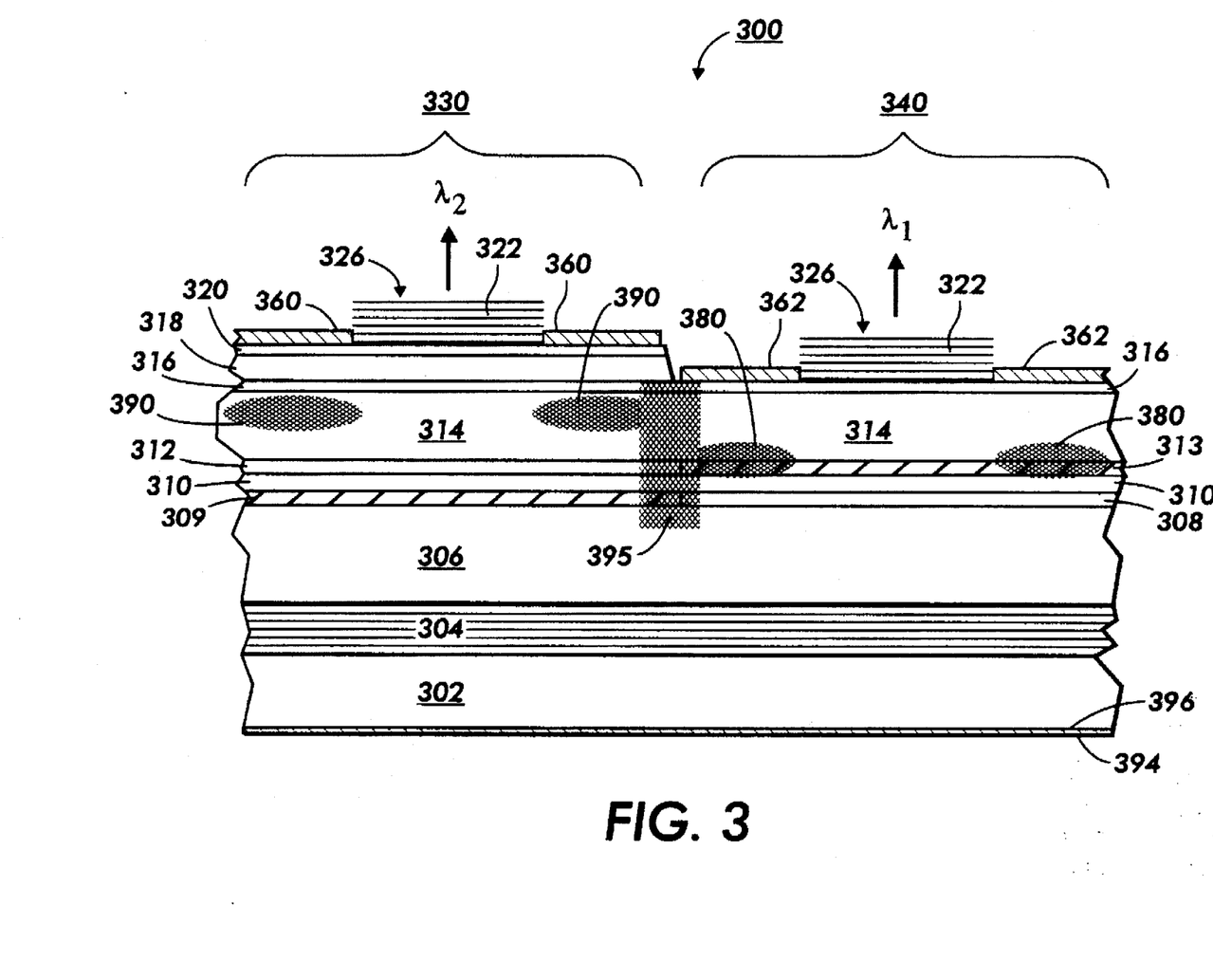
FIG. 3 is a schematic illustration of a cross-section side view of a third embodiment of a high density, dual wavelength, surface emitting monolithic laser structure with broad bandwidth Distributed Bragg Reflectors and with one active layer in each laser cavity formed according to the present invention.

Reference is now made to FIG. 3, wherein there is illustrated a high density, independently addressable, dual wavelength, surface emitting monolithic laser structure 300 as a third embodiment of this invention.

The monolithic laser structure 300 can be fabricated by a technique such as metalorganic chemical vapor deposition (MOCVD) as is well known in the art. In this embodiment, the monolithic laser structure 300 comprises a substrate 302 of n-GaAs upon which is epitaxially deposited a first or lower broad bandwidth DBR 304 of alternating layers of n-$Al_{0.5}Ga_{0.5}As$ and n-AlAs, a first or lower spacer layer 306 of n-$Al_xGa_{1-x}As$ ($0.5 < x < 0.8$) which is 20 to 200 nm thick, a first or lower active quantum well layer 308 of $Al_zGa_{1-z}As$ ($0 < z < 0.3$) which is 8 to 10 nm thick, a second or lower intermediate spacer layer 310 of undoped $Al_xGa_{1-x}As$ ($0.5 < x < 0.8$) which is 5 to 50 nm thick, a second or upper active quantum well layer 312 of GaAs which is 8 to 10 nm thick, a third or upper intermediate spacer layer 314 of p-$Al_xGa_{1-x}As$ ($0.5 < x < 0.8$) which is 20 to 200 nm thick, a first etch stop layer 316 of p-$Ga_{0.5}In_{0.5}P$ or p-GaAs which is nominally 5 nm thick, a fourth or upper spacer layer 318 of p-$Al_xGa_{1-x}As$ ($0.5 < x < 0.8$) which is 5 to 200 nm thick, and a protective contact layer 320 of p-$Ga_{0.5}In_{0.5}P$ or p-GaAs which is 4 to 10 nm thick.

The fourth or upper spacer layer 318 is selectively removed from a portion of the monolithic laser structure 300 by stopping after the growth of the protective layer 320 for etching. The thin etch stop layer 316 of $Ga_{0.5}In_{0.5}P$ or GaAs embedded below the upper spacer layer 318 serves as a stop etch layer and a protective layer for the epitaxial growth of an upper DBR in the etched region. Similarly the protective layer 320 provides an Al-free surface on which to epitaxially grow the upper DBR in the non-etched region after the selective etching.

A portion 330 of the monolithic laser structure 300 is covered by a mask and the remainder 340 is etched down to the first etch stop layer 316 as is well known in the art, thus removing portions of the protective layer 320 and the upper spacer layer 318.

Formation of the monolithic laser structure 300 continues after the etching with removal of the mask and epitaxial deposition upon the protective layer 320 of the non-etched portion and upon the etch stop layer 316 of the etched portion of a second or upper broad bandwidth DBR 322 of alternating layers of undoped AlAs and $Al_{0.5}Ga_{0.5}As$ with a top surface 326.

The first and second broad bandwidth DBRs 304 and 322 are similar to those described previously in connection with embodiment 100.

The active layer 312 is eliminated in laser cavity 340 by selectively intermixing the second active layer 312 in region 313. Similarly the active layer 308 is eliminated in laser cavity 330 by selectively intermixing the first active layer 308 in region 309. This selective intermixing in both laser cavities can be accomplished by using selective capping conditions to control layer intermixing from finite sources of impurities as described previously in connection with embodiment 200.

The first laser cavity 340 is under the etched portion within the monolithic structure 300 and consists of the first etch stop layer 316, the third or upper intermediate spacer layer 314, the selectively intermixed region 313, the second or lower intermediate spacer layer 310, the first active quantum well layer 308 and the first or lower spacer layer 306. The laser cavity can be formed with one of several different techniques. For example, the embodiment of FIG. 3 illustrates formation of a gain-guided cavity by confining the current with proton bombardment regions 380.

The second laser cavity 330 is under the non-etched portion within the monolithic structure 300 and consists of the protective layer 320, the fourth or upper spacer layer 318, the first etch stop layer 316, the third or upper intermediate spacer layer 314, the second active quantum well layer 312, the second or lower intermediate spacer layer 310, the selectively intermixed region 309, and the first or lower spacer layer 306. For example, the embodiment of FIG. 3 illustrates formation of a gain-guided cavity by confining the current with proton bombardment regions 390.

Following the patterned intermixing of the AlGaAs active region, the first and second laser cavities 340 and 330 are formed by established methods, as described earlier. Our preferred embodiment uses proton implantation regions 380 to confine the injection current in laser cavity 340, proton implantation regions 390 to confine the injection current in laser cavity 330, and an etched groove in region 395 to isolate the laser cavities.

Standard evaporation techniques are employed to form metal contacts to the first and second lasers. The upper DBR 322 can be locally patterned in order to expose contact layer 320 for laser 330 and contact layer 316 for laser 340 and to enable conversion of the AlAs layers in the as grown DBR to AlAs oxide as described previously in connection with the first embodiment 100.

The p-side of the first laser cavity 340 is contacted over the etched portion of the structure with an annular metal contact 362 of Cr—Au or Ti—Pt—Au on the top surface of the cap layer 316. Contact 394 to the n-side of the first laser cavity 340 is provided by an alloyed Au—Ge metallization, followed by Cr—Au or Ti—Pt—Au, on the bottom surface 196 of the substrate 102.

The p-side of the second laser cavity 330 is contacted over the non-etched portion of the structure with an annular metal contact 360 of Cr—Au or Ti—Pt—Au on the top surface of the contact layer 320. Contact 394 provides the contact to the n-side of the second laser cavity 330.

Voltage applied to the first contact 362 and the common contact 394 will cause the first active quantum well layer 308 of the first laser cavity 340 to emit light of a first wavelength through the emission window in the top surface of the laser structure 300 not covered by the first contact 362. The first cavity 340 only contains the first active quantum well layer 308.

Voltage applied to the second contact 360 and the and the common contact 394 will cause the second active quantum well layer 312 of the second laser cavity 330 to emit light of a second wavelength through the emission window in the top surface of the laser structure 300 not covered by the second contact 360. The second laser cavity 330 contains only the second active quantum well layer 312.

The laser cavity length in an edge emitter laser is many thousands of times the wavelength of the emitted light. Exacting precision in the laser cavity length is thus not critical in an edge emitter. On the contrary, the laser cavity length in a surface emitter laser is only a small single digit or low double digit multiple of the wavelength of the emitted light.

Accordingly, the thicknesses of the spacer layers are chosen to place each of the active quantum wells of the first and second active layers at the peak of the cavity's standing wave corresponding to the wavelength emitted by each quantum well. This matching of wavelength and laser cavity length avoids nulls and phase mismatching of the emitted light beam.

Thus, the first active layer 308 is physically positioned in the first cavity 340 at the peak of the standing wave of the red wavelength that the first active layer emits. And, the second active layer 312 is physically positioned in the second cavity 330 at the peak of the standing wave of the infrared wavelength that the second active layer emits. The first and second active layers may be positioned at the peak of their respective standing waves by locating each active layer at the center of its cavity. Alternatively, the second active layer may be positioned at the peak of its standing wave by using a cavity length that is 2 times the wavelength in the semiconductor and placing the active layer at ¼ of the cavity length below the upper DBR. Other asymmetric arrangements are possible for cavities that are integer multiples of the wavelength.

Figure 4:
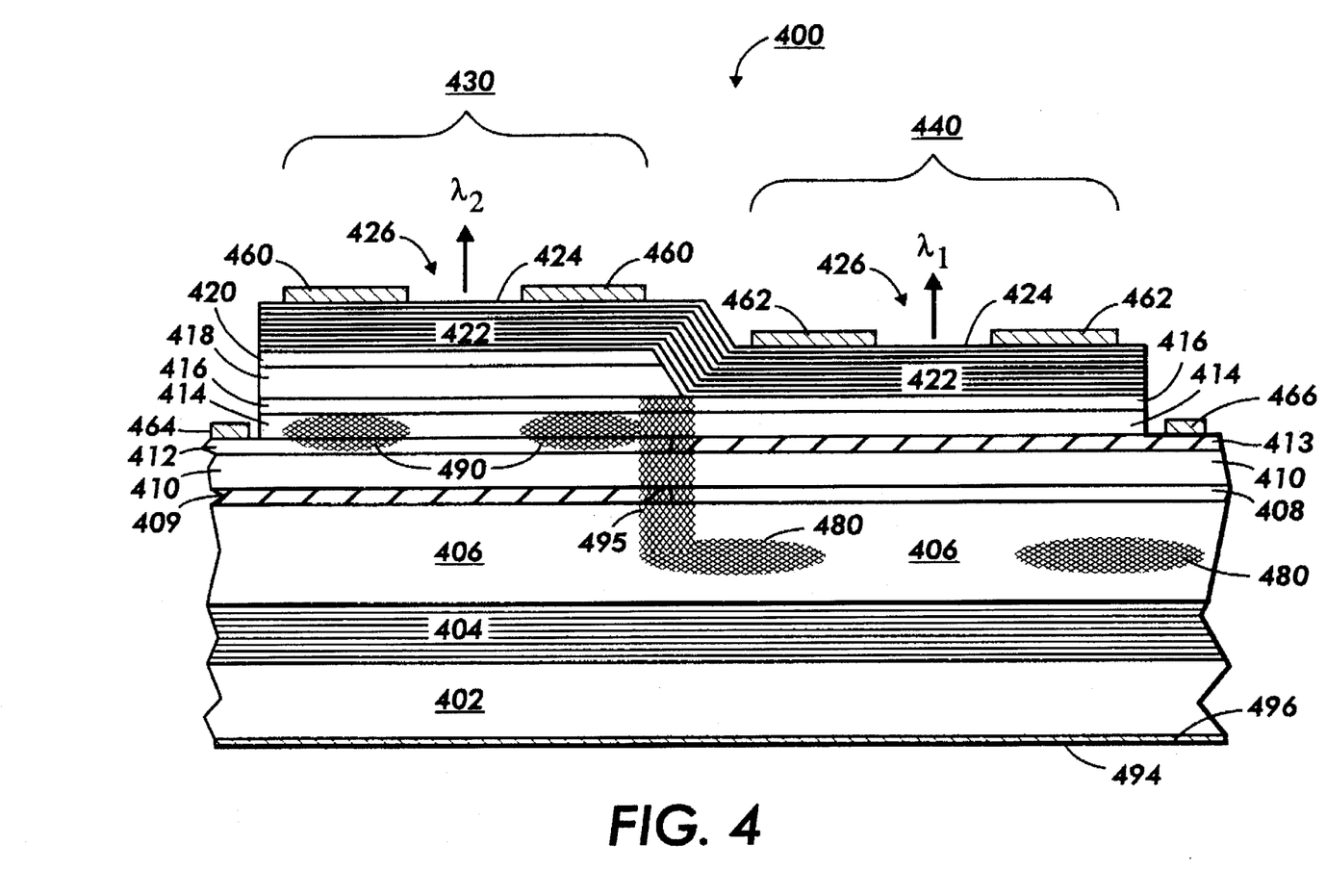
FIG. 4 is a schematic illustration of a cross-section side view of a fourth embodiment of a high density, dual wavelength, surface emitting monolithic laser structure with broad bandwidth Distributed Bragg Reflectors and with one active layer in each laser cavity formed according to the present invention.

Reference is now made to FIG. 4, wherein there is illustrated a high density, independently addressable, dual wavelength, surface emitting monolithic laser structure 400 as a fourth embodiment of this invention.

The monolithic laser structure 400 can be fabricated by a technique such as metalorganic chemical vapor deposition (MOCVD) as is well known in the art. In this embodiment, the monolithic laser structure 400 comprises a substrate 402 of n-GaAs upon which is epitaxially deposited a first or lower broad bandwidth DBR 404 of alternating layers of n-$Al_{0.5}Ga_{0.5}As$ and n-AlAs, a first or lower spacer layer 406 of n-$(Al_xGa_{1-x})_{0.5}In_{0.5}P$ ($0.5<x<1.0$) which is 20 to 200 nm thick, a first or lower active quantum well layer 408 of $Ga_xIn_{1-x}P$, which is 8 to 10 nm thick, a second or lower intermediate spacer layer 410 of p-$(Al_xGa_{1-x})_{0.5}In_{0.5}P$ ($0.5<x<1.0$) which is 20 to 200 nm thick, a second or upper active quantum well layer 412 of $Al_yGa_{1-y}As$ ($0<y<0.3$) which is 8 to 10 nm thick, a third or upper intermediate spacer layer 414 of n-$Al_xGa_{1-x}As$ ($0.5<x<0.8$) which is 20 to 200 nm thick, a first etch stop layer 416 of n-$Ga_{0.5}In_{0.5}P$ or GaAs which is nominally 5 nm thick, a fourth or upper spacer layer 418 of n-$(Al_xGa_{1-x})_{0.5}In_{0.5}P$ ($0.5<x<1.0$) or n-$Al_xGa_{1-x}As$ ($0.5<x<0.8$) which is 20 to 200 nm thick, and a protective layer 420 of n-$Ga_{0.5}In_{0.5}P$ or n-GaAs which is 4 to 10 nm thick.

The fourth or upper spacer layer 418 is selectively removed from a portion of the monolithic laser structure 400 by stopping after the growth of the protective layer 420 for etching. The thin etch stop layer 416 of $Ga_{0.5}In_{0.5}P$ or GaAs embedded below the upper spacer layer 418 serves as a stop etch layer and a protective layer for the epitaxial growth of an upper DBR in the etched region. Similarly the protective layer 420 provides an Al-free surface on which to epitaxially grow the upper DBR in the non-etched region after the selective etching.

A portion 430 of the monolithic laser structure 400 is covered by a mask and the remainder 440 is etched down to the first etch stop layer 416 as is well known in the art, thus removing portions of the protective layer 420 and upper spacer layer 418.

Formation of the monolithic laser structure 400 continues after the etching with removal of the mask and epitaxial deposition upon the protective layer 420 of the non-etched portion and upon the etch stop layer 416 of the etched portion of a second or upper broad bandwidth DBR 422 of alternating layers of n-$Al_{0.5}Ga_{0.5}As$ and n-AlAs, followed by a cap layer 424 of n-GaAs which is 5 to 100 nm thick with a top surface 426.

The second active layer 412 is eliminated in laser cavity 440 by selectively intermixing the second active layer 412 in region 413. Similarly the first active layer 408 is eliminated in laser cavity 430 by selectively intermixing the first active layer 408 in region 409. The selective intermixing can be accomplished by using selective capping conditions to control layer intermixing from finite sources of impurities as described previously in connection with embodiment 200.

The first laser cavity 440 is under the etched portion within the monolithic structure 400 and consists of the first etch stop layer 416, the third or upper intermediate spacer layer 414, the selectively intermixed region 413 of the second active quantum well layer, the second or lower intermediate spacer layer 410, the first active quantum well layer 408 and the first or lower spacer layer 406.

The second laser cavity 430 is under the non-etched portion within the monolithic structure 400 and consists of the protective layer 420, the fourth or upper spacer layer 418, the first etch stop layer 416, the third or upper intermediate spacer layer 414, the second active quantum well layer 412, the second or lower intermediate spacer layer 410, the selectively intermixed region 409 of the first active quantum well layer and the first or lower spacer layer 406.

Standard evaporation techniques are employed to form metal contacts to the first and second lasers. Contact 494 to the n-side of the first laser cavity 440 is provided by an alloyed Au—Ge metallization, followed by Cr—Au or Ti—Pt—Au, on the bottom surface 496 of the substrate 402. Contact 466 to the p-side of the first laser cavity 440 is provided by etching through the cap layer 424, the upper DBR 422, the protective layer 420, the upper spacer layer 418, the etch stop layer 416 and the third spacer layer 414 to the selectively intermixed region 413 of the second active quantum well layer in a region laterally displaced from proton bombarded regions 480. A skin diffusion of a p-type dopant, e.g. zinc, can be performed in this etched region in order to locally dope the intermixed region and thereby make ohmic contact to the underlying p-doped lower intermediate spacer layer 410. Metallization to this region is provided in the standard way with Cr—Au or Ti—Pt—Au on the exposed surface of intermixed region 413.

The n-side of the second laser cavity 430 is contacted over the non-etched portion of the structure with an annular metal contact 460 of alloyed Au—Ge metallizations, followed by Cr—Au or Ti—Pt—Au on the top surface 426 of the cap layer 424.

Contact 464 to the p-side of the second laser cavity 430 is provided by etching through the cap layer 424, the upper DBR 422, the protective layer 420, the upper spacer layer 418, the etch stop layer 416, the upper intermediate spacer layer 414 to the second active quantum well layer 412 used as an etch stop layer in a region laterally displaced from contact 460. A skin diffusion of a p-type dopant, e.g. zinc, is then performed in this etched region in order to locally dope the active layer and thereby make ohmic contact to the underlying p-doped lower intermediate spacer layer 410. Metallization to this region is provided in the standard way with Cr—Au or Ti—Pt—Au on the exposed surface of the second active layer 412.

The first active layer 408 of GaInP has a wider bandgap than the second active layer 412 of GaAs or AlGaAs and thus the first active layer 408 will lase at a shorter first wavelength than the second active layer 412. In this illustrative example, the first active layer of GaInP will lase in the red.

The second active layer 412 of GaAs or AlGaAs has a narrower bandgap than the first active layer 408 of GaInP and thus the second active layer 412 will lase at a longer second wavelength than the first active layer 408. In this illustrative example, the second active layer of GaAs or AlGaAs will lase in the infrared.

Voltage applied to the first lateral contact 466 and the substrate contact 494 will cause the first active quantum well layer 408 of the first laser cavity 440 to emit light of a first wavelength through the emission window in the top surface 426 of the laser structure 400. The first cavity 440 contains only the first active quantum well layer 408.

Voltage applied to the top contact 460 and the second lateral contact 464 to layer 410 will cause the second active quantum well layer 412 of the second laser cavity 430 to emit light of a second wavelength through the emission window in the top surface 426 of the laser structure 400 not covered by the contact 460. The second cavity 430 only contains only the second active quantum well layer 412.

The laser cavity length in an edge emitter laser is many thousands of times the wavelength of the emitted light. Exacting precision in the laser cavity length is thus not critical in an edge emitter. On the contrary, the laser cavity length in a surface emitter laser is only a small single digit or low double digit multiple of the wavelength of the emitted light.

Accordingly, the thicknesses of the confinement spacer layers are chosen to place each of the active quantum wells of the first and second active layers at the peak of the cavity's standing wave corresponding to the wavelength emitted by each quantum well. This matching of wavelength and laser cavity length avoids nulls and phase mismatching of the emitted light beam.

Thus, the first active layer 408 is physically positioned in the first cavity 440 at the peak of the standing wave of the infrared wavelength that the first active layer emits. And, the second active layer 412 is physically positioned in the second cavity 430 at the peak of the standing wave of the red wavelength that the second active layer emits. The first and second active layers may be positioned at the peak of their respective standing waves by locating each active layer at the center of its cavity. Alternatively, the active layers may be positioned at the peak of its standing wave by using a cavity length that is 2 times the wavelength in the semiconductor and placing the active layer at ¼ of the cavity length below the upper DBR. Other asymmetric arrangements are possible for cavities that are integer multiples of the wavelength.

The second active quantum well layer 412 can alternatively comprise GaAsP, InGaAsP, or AlGaAsP, all materials which emit light in the infrared spectrum. Alternatively, the single active quantum wells can be replaced by multiple quantum wells separated by appropriate barrier layers as is well known in the art. Also the upper DBR and lower DBR can comprise alternating layers of InAlP and InAlGaP.

The active layers may, in the alternative, be GaAs, $Al_yGa_{1-y}As$, $Ga_xIn_{1-x}P$ or $(Al_xGa_{1-x})_{0.5}In_{0.5}P$, or a relatively thin conventional double heterostructure (DH) active layer; or a single quantum well, such as GaAs or $Al_yGa_{1-y}As$ where y is very small and y<x; or a multiple quantum well superlattice, such as alternating layers of GaAs and $Al_yGa_{1-y}As$ where y<x or alternating layers of $Al_wGa_{1-w}As$ and $Al_BGa_{1-B}As$ where w<B<x with a second confinement layer of p-$Al_zGa_{1-z}As$ where w<B<z; or a separate single or multiple quantum well structure in a separate confinement cavity; so long as the bandgaps of the first and second active layers are different and the upper DBR and lower DBR will reflect the wavelengths emitted by both active layers. Alternately, the first active layer and the second active layer can be the same semiconductor material for light emission under lasing conditions but a different thickness yielding different wavelengths.

Figure 5:
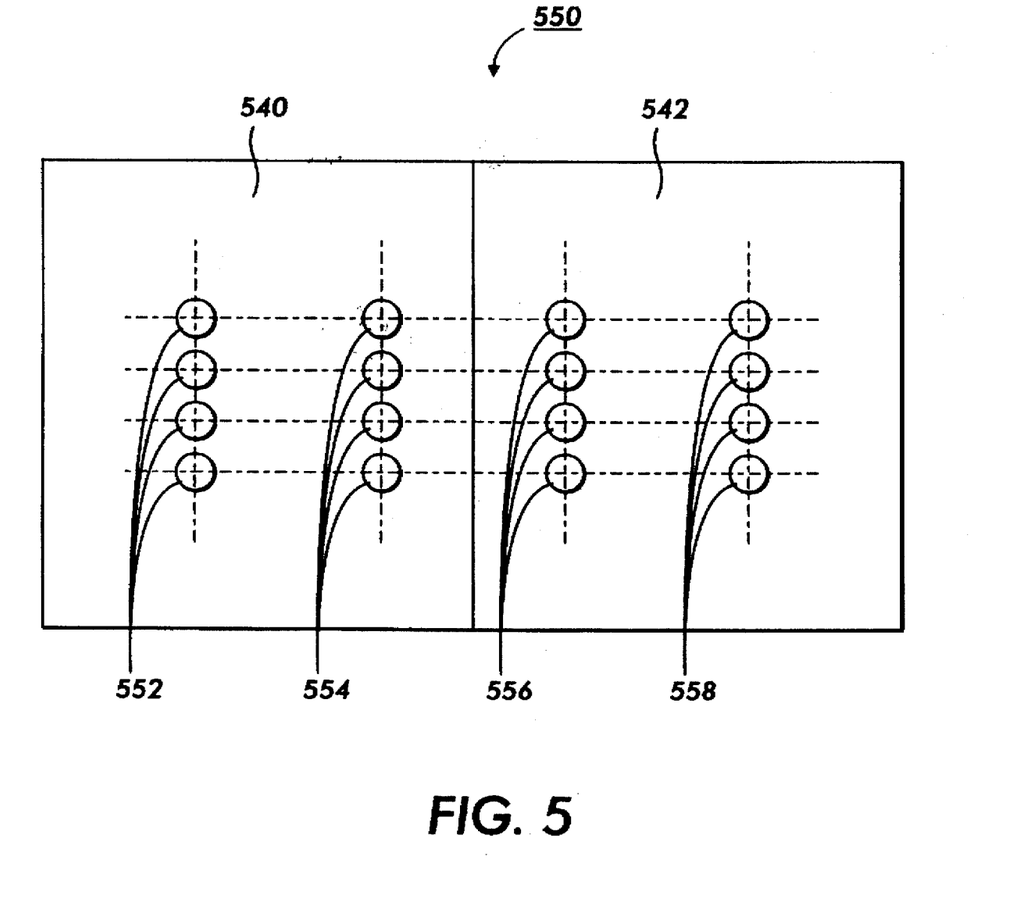
FIG. 5 is a schematic illustration of a top view of a multiple wavelength surface emitting monolithic laser structure formed according to the present invention.

A preferred arrangement of multiple wavelength surface emitting lasers is laser structure 550, shown schematically in top view in FIG. 5. For this arrangement, laser elements 552 emit light at wavelength $\lambda_1$, laser elements 554 emit light at shorter wavelength $\lambda_2$, laser elements 556 emit light at still shorter wavelength $\lambda_3$, and laser elements 558 emit light at the shortest wavelength $\lambda_4$. Laser elements at each wavelength are spaced closer than the groups. Typically laser elements at each wavelength are separated by 10 to 50 µm from each other, while the groups at different wavelengths are separated by 100 to 500 µm from each. Multiple wavelength arrays of surface emitting lasers of this configuration are especially useful in printing architectures taught in U.S. Pat. No. 5,243,359, commonly assigned as the present application and herein incorporated by reference.

The laser array structure 550 of FIG. 5 can beneficially be a nonmonolithic combination of two high density, independently addressable, dual wavelength, surface emitting monolithic laser structures 540 and 542 formed according this invention. Each monolithic structure contains two linear arrays of VCSELs emitting at different wavelengths.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

I claim:

1. A dual wavelength, surface emitting laser comprising
   a substrate,
   a first broad bandwidth distributed Bragg reflector deposited on said substrate, said first broad bandwidth distributed Bragg reflector reflecting light of a first and second wavelengths,
   a first spacer layer deposited on said first broad bandwidth distributed Bragg reflector,
   a first active layer deposited on said first spacer layer, said first active layer for emitting light of a first wavelength,
   a second spacer layer deposited on said first active layer,
   a second active layer deposited on said second spacer layer, said second active layer for emitting light of a second wavelength, said second wavelength being longer than said first wavelength, wherein a portion of said second active layer is selectively intermixed to form a selectively intermixed region,
   a third spacer layer deposited on said second active layer and said selectively intermixed region,
   a first etch stop layer deposited on said third spacer layer,
   a fourth spacer layer deposited on said first etch stop layer,
   a second etch stop layer partially covering said fourth spacer layer, wherein said fourth spacer layer is etched down to said first etch stop layer in the region not covered with said second etch stop layer, wherein a first laser cavity is formed from said first etch stop layer, said third spacer layer, said selectively intermixed region, said second spacer layer, said first active layer, and said first spacer layer under the region not covered with said second etch stop layer, and further wherein a second laser cavity is formed from said second etch stop layer, said fourth spacer layer, said first etch stop layer, said third spacer layer, said second active layer, said second spacer layer, said first active layer, and said first spacer layer under the region covered with said second etch stop layer,
   a second broad bandwidth distributed Bragg reflector deposited on said second etch stop and on said first etch stop, said second broad bandwidth distributed Bragg reflector reflecting light of a first and second wavelengths
   a common electrode deposited on said substrate on the opposite side from said first broad bandwidth distributed Bragg reflector,
   at least a first electrode for passing current through said first active layer in said first laser cavity thereby causing light emission at said first wavelength from said first active layer through said second broad bandwidth distributed Bragg reflector, and
   at least a second electrode for passing current through said first and second active layers in said second laser cavity thereby causing light emission at said second wavelength from said second active layer through said second broad bandwidth distributed Bragg reflector.

2. The dual wavelength, surface emitting laser of claim 1 wherein said first active layer within said first laser cavity is at the peak of the standing wave corresponding to said first wavelength emitted by said first active layer or an integer multiple of said first wavelength and further wherein said second active layer within said second laser cavity is at the peak of the standing wave corresponding to said second wavelength emitted by said second active layer or an integer multiple of said second wavelength.

3. The dual wavelength, surface emitting laser of claim 1 wherein said first and second active layers have different bandgaps.

4. The dual wavelength, surface emitting laser of claim 1 wherein said first active layer is AlGaInP or GaInP and said second active layer is AlGaAs or GaAs.

5. The dual wavelength, surface emitting laser of claim 1 wherein said first and second wavelengths are separated by at least 50 nanometers.

6. The dual wavelength, surface emitting laser of claim 1, further comprising a cap layer deposited on said second broad bandwidth distributed Bragg reflector, wherein said first and second electrodes are deposited on said cap layer.

7. The dual wavelength, surface emitting laser of claim 1, wherein said first electrode is deposited on said first etch stop layer and said second electrode is deposited on said second etch stop layer.

8. A dual wavelength, surface emitting laser comprising
   a substrate,
   a first broad bandwidth distributed Bragg reflector deposited on said substrate, said first broad bandwidth distributed Bragg reflector reflecting light of a first and second wavelengths, a first spacer layer deposited on said first broad bandwidth distributed Bragg reflector, a first active layer deposited on said first spacer layer, said first active layer for emitting light of a first wavelength, a second spacer layer deposited on said first active layer, a second active layer deposited on said second spacer layer, said second active layer for emitting light of a second wavelength, said second wavelength being longer than said first wavelength, wherein a portion of said second active layer is selectively intermixed to form a selectively intermixed region, a third spacer layer deposited on said second active layer and said selectively intermixed region, a first etch stop layer deposited on said third spacer layer, a fourth spacer layer deposited on said first etch stop layer, a second etch stop layer partially covering said fourth spacer layer, wherein said fourth spacer layer is etched down to said first etch stop layer in the region not covered with said second etch stop layer, wherein a first laser cavity is formed from said first etch stop layer, said third spacer layer, said selectively intermixed region, said second spacer layer, said first active layer, and said first spacer layer under the region not covered with said second etch stop layer, and further wherein a second laser cavity is formed from said second etch stop layer, said fourth spacer layer, said first etch stop layer, said third spacer layer, said second active layer, said second spacer layer, said first active layer, and said first spacer layer under the region covered with said second etch stop layer, a second broad bandwidth distributed Bragg reflector deposited on said second etch stop and on said first etch stop, said second broad bandwidth distributed Bragg reflector reflecting light of a first and second wavelengths, at least a first cathode and a first anode formed for passing current through said first active layer in said first laser cavity thereby causing light emission at said first wavelength from said first active layer through said second broad bandwidth distributed Bragg reflector, and at least a second cathode and a second anode formed for passing current through said first and second active layers in said second laser cavity thereby causing light emission at said second wavelength from said second active layer through said second broad bandwidth distributed Bragg reflector.

9. The dual wavelength, surface emitting laser of claim 8 wherein said first active layer within said first laser cavity is at the peak of the standing wave corresponding to said first wavelength emitted by said first active layer or an integer multiple of said first wavelength and further wherein said second active layer within said second laser cavity is at the peak of the standing wave corresponding to said second wavelength emitted by said second active layer or an integer multiple of said second wavelength.

10. The dual wavelength, surface emitting laser of claim 8 wherein said first and second active layers have different compositions.

11. The dual wavelength, surface emitting laser of claim 8 wherein said first active layer is AlGaAs or GaAs and said second active layer is AlGaInP or GaInP.

12. The dual wavelength, surface emitting laser of claim 8 wherein said first and second wavelengths are separated by at least 50 nanometers.

13. A dual wavelength, surface emitting laser comprising a substrate, a first broad bandwidth distributed Bragg reflector deposited on said substrate, said first broad bandwidth distributed Bragg reflector reflecting light of a first and second wavelengths, a first spacer layer deposited on said first broad bandwidth distributed Bragg reflector, a first active layer deposited on said first spacer layer, said first active layer for emitting light of a first wavelength, wherein a portion of said first active layer is selectively intermixed to form a first selectively intermixed region, a second spacer layer deposited on said first active layer and said first selectively intermixed region, a second active layer deposited on said second spacer layer, said second active layer for emitting light of a second wavelength, said second wavelength being longer than said first wavelength, wherein a portion of said second active layer is selectively intermixed to form a second selectively intermixed region, a third spacer layer deposited on said second active layer and said selectively intermixed region, a first etch stop layer deposited on said third spacer layer, a fourth spacer layer deposited on said first etch stop layer, a second etch stop layer partially covering said fourth spacer layer, wherein said fourth spacer layer is etched down to said first etch stop layer in the region not covered with said second etch stop layer, wherein a first laser cavity is formed from said first etch stop layer, said third spacer layer, said second selectively intermixed region, said second spacer layer, said first active layer, and said first spacer layer under the region not covered with said second etch stop layer, and further wherein a second laser cavity is formed from said second etch stop layer, said fourth spacer layer, said first etch stop layer, said third spacer layer, said second active layer, said second spacer layer, said first selectively intermixed region, and said first spacer layer under the region covered with said second etch stop layer, a second broad bandwidth distributed Bragg reflector deposited on said second etch stop and on said first etch stop, said second broad bandwidth distributed Bragg reflector reflecting light of a first and second wavelengths, a common electrode deposited on said substrate on the opposite side from said first broad bandwidth distributed Bragg reflector, at least a first electrode for passing current through said first active layer in said first laser cavity thereby causing light emission at said first wavelength from said first active layer through said second broad bandwidth distributed Bragg reflector, and at least a second electrode for passing current through said second active layers in said second laser cavity thereby causing light emission at said second wavelength from said second active layer through said second broad bandwidth distributed Bragg reflector.

14. The dual wavelength, surface emitting laser of claim 13 wherein said first active layer within said first laser cavity is at the peak of the standing wave corresponding to said first wavelength emitted by said first active layer or an integer multiple of said first wavelength and further wherein said second active layer within said second laser cavity is at the peak of the standing wave corresponding to said second wavelength emitted by said second active layer or an integer multiple of said second wavelength.

15. The dual wavelength, surface emitting laser of claim 13 wherein said first and second active layers have different bandgaps.

16. The dual wavelength, surface emitting laser of claim 13 wherein said first active layer is AlGaInP or GaInP and said second active layer is AlGaAs or GaAs.

17. The dual wavelength, surface emitting laser of claim 13 wherein said first and second wavelengths are separated by at least 50 nanometers.

18. The dual wavelength, surface emitting laser of claim 13, further comprising a cap layer deposited on said second broad bandwidth distributed Bragg reflector, wherein said first and second electrodes are deposited on said cap layer.

19. The dual wavelength, surface emitting laser of claim 13, wherein said first electrode is deposited on said first etch stop layer and said second electrode is deposited on said second etch stop layer.

20. A dual wavelength, surface emitting laser comprising
a substrate,
a first broad bandwidth distributed Bragg reflector deposited on said substrate, said first broad bandwidth distributed Bragg reflector reflecting light of a first and second wavelengths,
a first spacer layer deposited on said first broad bandwidth distributed Bragg reflector,
a first active layer deposited on said first spacer layer, said first active layer for emitting light of a first wavelength, wherein a portion of said first active layer is selectively intermixed to form a first selectively intermixed region,
a second spacer layer deposited on said first active layer and said first selectively intermixed region,
a second active layer deposited on said second spacer layer, said second active layer for emitting light of a second wavelength, said second wavelength being longer than said first wavelength, wherein a portion of said second active layer is selectively intermixed to form a second selectively intermixed region,
a third spacer layer deposited on said second active layer and said selectively intermixed region,
a first etch stop layer deposited on said third spacer layer,
a fourth spacer layer deposited on said first etch stop layer,
a second etch stop layer partially covering said fourth spacer layer, wherein said fourth spacer layer is etched down to said first etch stop layer in the region not covered with said second etch stop layer, wherein a first laser cavity is formed from said first etch stop layer, said third spacer layer, said second selectively intermixed region, said second spacer layer, said first active layer, and said first spacer layer under the region not covered with said second etch stop layer, and further wherein a second laser cavity is formed from said second etch stop layer, said fourth spacer layer, said first etch stop layer, said third spacer layer, said second active layer, said second spacer layer, said first selectively intermixed region, and said first spacer layer under the region covered with said second etch stop layer,
a second broad bandwidth distributed Bragg reflector deposited on said second etch stop and on said first etch stop, said second broad bandwidth distributed Bragg reflector reflecting light of a first and second wavelengths,
at least a first cathode and a first anode formed for passing current through said first active layer in said first laser cavity thereby causing light emission at said first wavelength from said first active layer through said second broad bandwidth distributed Bragg reflector, and
at least a second cathode and a second anode formed for passing current through said first and second active layers in said second laser cavity thereby causing light emission at said second wavelength from said second active layer through said second broad bandwidth distributed Bragg reflector.

21. The dual wavelength, surface emitting laser of claim 20 wherein said first active layer within said first laser cavity is at the peak of the standing wave corresponding to said first wavelength emitted by said first active layer or an integer multiple of said first wavelength and further wherein said second active layer within said second laser cavity is at the peak of the standing wave corresponding to said second wavelength emitted by said second active layer or an integer multiple of said second wavelength.

22. The dual wavelength, surface emitting laser of claim 20 wherein said first and second active layers have different bandgaps.

23. The dual wavelength, surface emitting laser of claim 20 wherein said first active layer is AlGaInP or GaInP and said second active layer is AlGaAs or GaAs.

24. The dual wavelength, surface emitting laser of claim 20 wherein said first and second wavelengths are separated by at least 50 nanometers.

25. A dual wavelength, surface emitting laser comprising
a substrate,
a first broad bandwidth distributed Bragg reflector deposited on said substrate, said first broad bandwidth distributed Bragg reflector reflecting light of a first and second wavelengths,
a first spacer layer deposited on said first broad bandwidth distributed Bragg reflector,
a first active layer deposited on said first spacer layer, said first active layer for emitting light of a first wavelength,
a second spacer layer deposited on said first active layer,
a second active layer deposited on said second spacer layer, said second active layer for emitting light of a second wavelength, said second wavelength being longer than said first wavelength, wherein a portion of said second active layer is selectively intermixed to form a selectively intermixed region,
a third spacer layer deposited on said second active layer and said selectively intermixed region,
a first etch stop layer deposited on said third spacer layer,
a fourth spacer layer deposited on said first etch stop layer,
a second etch stop layer partially covering said fourth spacer layer, wherein said fourth spacer layer is etched down to said first etch stop layer in the region not covered with said second etch stop layer, wherein a first laser cavity is formed from said first etch stop layer, said third spacer layer, said selectively intermixed region, said second spacer layer, said first active layer, and said first spacer layer under the region not covered with said second etch stop layer, and further wherein a second laser cavity is formed from said second etch stop layer, said fourth spacer layer, said first etch stop layer, said third spacer layer, said second active layer, said second spacer layer, said first active layer, and said first spacer layer under the region covered with said second etch stop layer,
a second broad bandwidth distributed Bragg reflector deposited on said second etch stop and on said first etch stop, said second broad bandwidth distributed Bragg reflector reflecting light of a first and second wavelengths, at least a first electrode deposited on said selectively intermixed region and a second electrode deposited on said substrate on the opposite side from said first broad bandwidth distributed Bragg reflector for passing current through said first active layer in said first laser cavity thereby causing light emission at said first wavelength from said first active layer through said second broad bandwidth distributed Bragg reflector, and at least a third electrode deposited on cap layer deposited on said second broad bandwidth DBR and a fourth electrode deposited on said second active layer for passing current through said second active layer in said second laser cavity thereby causing light emission at said second wavelength from said second active layer through said second broad bandwidth distributed Bragg reflector.

26. The dual wavelength, surface emitting laser of claim 25 wherein said first active layer within said first laser cavity is at the peak of the standing wave corresponding to said first wavelength emitted by said first active layer or an integer multiple of said first wavelength and further wherein said second active layer within said second laser cavity is at the peak of the standing wave corresponding to said second wavelength emitted by said second active layer or an integer multiple of said second wavelength.

27. The dual wavelength, surface emitting laser of claim 25 wherein said first and second active layers have different bandgaps.

28. The dual wavelength, surface emitting laser of claim 25 wherein said first active layer is AlGaInP or GaInP and said second active layer is AlGaAs or GaAs.

29. The dual wavelength, surface emitting laser of claim 25 wherein said first and second wavelengths are separated by at least 50 nanometers.

30. A dual wavelength, surface emitting laser comprising a substrate, a first broad bandwidth distributed Bragg reflector deposited on said substrate, said first broad bandwidth distributed Bragg reflector reflecting light of a first and second wavelengths, a first spacer layer deposited on said first broad bandwidth distributed Bragg reflector, a first active layer deposited on said first spacer layer, said first active layer for emitting light of a first wavelength, wherein a portion of said first active layer is selectively intermixed to form a first selectively intermixed region, a second spacer layer deposited on said first active layer and said first selectively intermixed region, a second active layer deposited on said second spacer layer, said second active layer for emitting light of a second wavelength, said second wavelength being longer than said first wavelength, wherein a portion of said second active layer is selectively intermixed to form a second selectively intermixed region, a third spacer layer deposited on said second active layer and said selectively intermixed region, a first etch stop layer deposited on said third spacer layer, a fourth spacer layer deposited on said first etch stop layer, a second etch stop layer partially covering said fourth spacer layer, wherein said fourth spacer layer is etched down to said first etch stop layer in the region not covered with said second etch stop layer, wherein a first laser cavity is formed from said first etch stop layer, said third spacer layer, said second selectively intermixed region, said second spacer layer, said first active layer, and said first spacer layer under the region not covered with said second etch stop layer, and further wherein a second laser cavity is formed from said second etch stop layer, said fourth spacer layer, said first etch stop layer, said third spacer layer, said second active layer, said second spacer layer, said first selectively intermixed region, and said first spacer layer under the region covered with said second etch stop layer, a second broad bandwidth distributed Bragg reflector deposited on said second etch stop and on said first etch stop, said second broad bandwidth distributed Bragg reflector reflecting light of a first and second wavelengths, a cap layer deposited on said second broad bandwidth distributed Bragg reflector, at least a first electrode deposited on said second selectively intermixed region and a second electrode deposited on said substrate on the opposite side from said first broad bandwidth distributed Bragg reflector for passing current through said first active layer in said first laser cavity thereby causing light emission at said first wavelength from said first active layer through said second broad bandwidth distributed Bragg reflector, and at least a third electrode deposited on cap layer deposited on said second broad bandwidth DBR and a fourth electrode deposited on said second active layer for passing current through said second active layer in said second laser cavity thereby causing light emission at said second wavelength from said second active layer through said second broad bandwidth distributed Bragg reflector.

31. The dual wavelength, surface emitting laser of claim 30 wherein said first active layer within said first laser cavity is at the peak of the standing wave corresponding to said first wavelength emitted by said first active layer or an integer multiple of said first wavelength and further wherein said second active layer within said second laser cavity is at the peak of the standing wave corresponding to said second wavelength emitted by said second active layer or an integer multiple of said second wavelength.

32. The dual wavelength, surface emitting laser of claim 30 wherein said first and second active layers have different bandgaps.

33. The dual wavelength, surface emitting laser of claim 30 wherein said first active layer is AlGaInP or GaInP and said second active layer is AlGaAs or GaAs.

34. The dual wavelength, surface emitting laser of claim 30 wherein said first and second wavelengths are separated by at least 50 nanometers.

* * * * *